(12) United States Patent
Yamada et al.

(10) Patent No.: US 7,018,701 B2
(45) Date of Patent: Mar. 28, 2006

(54) THERMALLY CONDUCTIVE SHEET AND METHOD FOR MANUFACTURING THE SAME

(75) Inventors: Shunsuke Yamada, Aichi (JP); Hajime Funahashi, Aichi (JP); Junzo Shiomi, Tokyo (JP)

(73) Assignee: Fuji Polymer Industries Co., Ltd., Nagoya (JP)

( * ) Notice: Subject to any disclaimer, the term of this patent is extended or adjusted under 35 U.S.C. 154(b) by 112 days.

(21) Appl. No.: 10/455,460

(22) Filed: Jun. 4, 2003

(65) Prior Publication Data

US 2004/0018342 A1    Jan. 29, 2004

(30) Foreign Application Priority Data

Jun. 6, 2002    (JP) .............................. 2002-166258

(51) Int. Cl.
| | |
|---|---|
| B32B 3/10 | (2006.01) |
| B32B 27/32 | (2006.01) |
| C08K 3/22 | (2006.01) |
| C08K 3/14 | (2006.01) |
| H05K 7/20 | (2006.01) |

(52) U.S. Cl. ....................... 428/137; 428/500; 428/521; 428/523; 524/431; 524/433; 524/435; 524/439; 524/526; 361/676; 361/688; 361/704; 361/708; 361/714; 165/185

(58) Field of Classification Search ................ 428/137, 428/500, 521, 523; 524/431, 433, 435, 439, 524/526; 165/185; 361/688, 704, 708, 714, 361/676; 257/720
See application file for complete search history.

(56) References Cited

U.S. PATENT DOCUMENTS

| | | | | |
|---|---|---|---|---|
| 3,470,127 | A | * 9/1969 | Freeman et al. | 524/526 |
| 4,071,652 | A | * 1/1978 | Brullo | 428/323 |
| 4,758,631 | A | * 7/1988 | Kennedy et al. | 525/245 |
| 5,014,777 | A | 5/1991 | Sano | 165/185 |
| 5,741,579 | A | * 4/1998 | Nishizawa | 428/215 |
| 5,837,164 | A | * 11/1998 | Zhao | 252/500 |
| 6,517,744 | B1 | * 2/2003 | Hara et al. | 252/506 |
| 6,555,620 | B1 | * 4/2003 | Manabe et al. | 525/106 |
| 2002/0068145 | A1* | 6/2002 | Ducros et al. | 428/100 |
| 2002/0197923 | A1* | 12/2002 | Tobita et al. | 442/74 |
| 2003/0220432 | A1* | 11/2003 | Miller et al. | 524/439 |

FOREIGN PATENT DOCUMENTS

JP    59176341 A    * 10/1984

(Continued)

OTHER PUBLICATIONS

Machine Translation of JP 10-132493 A.*
Machine Translation of JP 2001-162703 A.*

*Primary Examiner*—Harold Pyon
*Assistant Examiner*—Chris Bruenjes
(74) *Attorney, Agent, or Firm*—Hamre, Schumann, Mueller & Larson, P.C.

(57) ABSTRACT

A thermally conductive sheet includes a polyolefin elastomer mixed with a thermally conductive filler. The amount of volatile organic gas generated from the sheet is not more than 1000 μg/cm$^2$ per unit surface area. The amount of volatile corrosive gas generated from the sheet is not more than 10 μg/cm$^2$ per unit surface area. The sheet has a thermal conductivity of 0.5 to 20 W/m·K. This thermally conductive sheet generates fewer volatile substances and can be used even in a closed place.

12 Claims, 1 Drawing Sheet

FOREIGN PATENT DOCUMENTS

| | | | |
|---|---|---|---|
| JP | 2-196453 | 3/1990 | |
| JP | 2-166755 | 6/1990 | |
| JP | 03151658 A | * 6/1991 | |
| JP | 6-155517 | 6/1994 | |
| JP | 10132493 A | * 5/1998 | |
| JP | 2001162703 A | * 6/2001 | |

* cited by examiner

US 7,018,701 B2

THERMALLY CONDUCTIVE SHEET AND METHOD FOR MANUFACTURING THE SAME

BACKGROUND OF THE INVENTION

1. Field of the Invention

The present invention relates to a thermally conductive sheet used, e.g., in the heat radiation/cooling structure of a heat-generating electronic component and a method for manufacturing the thermally conductive sheet.

2. Description of the Related Art

The following thermally conductive sheets or thermally conductive materials have been proposed as a conventional thermally conductive sheet used in part of the heat radiation/cooling structure of heat-generating electronic components or the like mounted on a substrate. Depending on the package structure of equipment, when the influence of a volatile organic gas generated from the thermally conductive sheet on the function of electronic components can be ignored, a thermally conductive sheet that includes a silicone polymer and a thermally conductive filler generally is used. Typical examples of this thermally conductive sheet are disclosed in JP 2(1990)-166755 A, JP 2(1990)-196453 A, and JP 6(1994)-155517 A. However, the thermally conductive sheets of these publications include low molecular-weight siloxane, which is volatilized by heat generated from the heat-generating electronic components. Therefore, when the package of equipment should be sealed hermetically, those thermally conductive sheets are not suitable. In many cases, a thermally conductive epoxy adhesive or the like is used as a thermally conductive material for heat-generating electronic components in the sealed electronic equipment.

The amount of heat generated from heat-generating electronic components increases with higher performance and smaller size of the components. Particularly, it becomes very difficult to cool the components in sealed electronic equipment. Moreover, the thermally conductive epoxy adhesive or the like is used in paste form and has a high viscosity, causing many problems in assembly such as poor workability and a long time required for curing. Also, conventional materials are not resistant sufficiently to heat generated from the heat-generating electronic components.

SUMMARY OF THE INVENTION

Therefore, with the foregoing in mind, it is an object of the present invention to provide a thermally conductive sheet that generates fewer volatile substances and can be used as a thermally conductive material for heat-generating electronic components in the conventional sealed electronic equipment, and a method for manufacturing the thermally conductive sheet.

A thermally conductive sheet of the present invention includes a polyolefin elastomer mixed with a thermally conductive filler. The amount of volatile organic gas generated from the thermally conductive sheet is not more than 1000 $\mu g/cm^2$ per unit surface area. The amount of volatile corrosive gas generated from the thermally conductive sheet is not more than 10 $\mu g/cm^2$ per unit surface area. The thermally conductive sheet has a thermal conductivity of 0.5 to 20 W/m·K.

A method for manufacturing a thermally conductive sheet of the present invention includes mixing a polyolefin elastomer with a thermally conductive filler, and removing volatile components, including a residual solvent and an unreacted residual material, contained in the polyolefin elastomer by distillation or reduced-pressure aspiration during or before producing the thermal conducive sheet. The amount of volatile organic gas generated from the thermally conductive sheet is not more than 1000 $\mu g/cm^2$ per unit surface area. The amount of volatile corrosive gas generated from the thermally conductive sheet is not more than 10 $\mu g/cm^2$ per unit surface area. The thermally conductive sheet has a thermal conductivity of 0.5 to 20 W/m·K

DESCRIPTION OF THE PREFERRED EMBODIMENTS

Figure 1A:
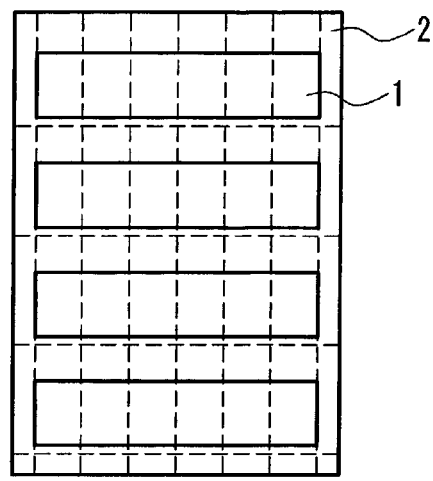
FIG. 1A is a plan view of a thermally conductive sheet according to an embodiment of the present invention.

The polyolefin elastomer of a thermally conductive sheet of the present invention reduces volatile substances as much as possible, e.g., a solvent that has been used for producing the polyolefin elastomer, a monomer that has been used for forming a desired polymer, or an oligomer and other low molecular-weight additives.

Various kinds of polyolefin elastomer are commercially available, and an elastomer obtained by introducing an allyl group at both terminals of polyisobutylene can be used in the present invention. This polyolefin elastomer based polymer is on the market as "EP200A," which is manufactured by Kaneka Corporation.

The thermally conductive sheet of the present invention can further have the electromagnetic wave absorption characteristics that show a voltage attenuation of not less than 4 dB, and preferably not less than 10 dB in a frequency range of 10 to 1000 MHz. This makes it possible to effectively suppress a harmful electromagnetic wave generated by some heat-generating electronic components. The electromagnetic wave absorption characteristics can be provided by the inclusion of at least one magnetic metal powder selected from the group consisting of ferrite powder, nickel powder, carbonyl iron powder, aluminum powder, silver powder, and amorphous alloy powder. It is preferable that 100 parts by weight of polyolefin elastomer is mixed with 100 to 2000 parts by weight of magnetic metal powder.

In the present specification, "100 parts by weight of polyolefin elastomer" is used simply as a reference weight to determine the amount of other compounds.

It is preferable that the thermally conductive sheet has elasticity and flexibility, and the hardness is 5 to 95 when measured by a Type A durometer under the ASTM D2240 standards or is not more than 95 when measured by an Asker C durometer under the SRIS 0101 standards.

The thermally conductive filler to be mixed with the polyolefin elastomer may be selected from the group consisting of a metal oxide, a metal nitride, and a metal carbide. It is preferable that the purity of the filler is as high as the components of the polyolefin elastomer. The metal oxide is suitable particularly for the filler.

It is preferable that the thermally conductive filler is selected from the group consisting of an aluminum oxide, a magnesium oxide, a zinc oxide, a potassium oxide, an aluminum nitride, a boron nitride, a silicon nitride, a silicon carbide, and a boron carbide. The amount of thermally conductive filler is preferably 50 to 3000 parts by weight, and more preferably 400 to 2200 parts by weight with respect to 100 parts by weight of polyolefin elastomer.

Metal powder, ferrite powder, or the like can be used to provide the electromagnetic wave shielding effect and selected appropriately in accordance with the frequency of an electromagnetic wave that should be blocked. The type of filler is not limited to one, and more than one filler may be added.

The sweat or oily substances attached to hands may cause outgassing. Therefore, care should be taken not to touch the thermally conductive sheet directly with hands. It is preferable that the thermally conductive sheet has, e.g., a tab by which it can be held in the hands.

It is further preferable that the thermally conductive sheet is affixed temporarily at a desired position with its own adhesion, and then a release film is peeled off.

The polyolefin elastomer is preferred to be solventless and liquid. In many cases, the liquid polyolefin elastomer is produced in a petroleum solvent, so that the final product always includes a residual solvent.

Not only the residual solvent, but also a low molecular-weight unreacted residual material causes outgassing.

Therefore, it is preferable that the residual solvent and the residual material should be removed by distillation or reduced-pressure aspiration.

The organic gas is measured preferably in such a manner that a gas generated by heating a test sample is evaluated both quantitatively and qualitatively by as gas chromatography-mass spectrum (GC-MS). The corrosive gas is measured preferably in such a manner that a liquid extracted by using ultrapure water is evaluated both quantitatively and qualitatively by ion chromatography.

When used in the present invention, the polyolefin elastomer should be cured. Therefore, it is preferable that the polyolefin elastomer includes a functional group at the terminals or the like for curing. The functional group can be a vinyl group or a hydroxy group, and a crosslinking agent includes a functional group that reacts with these functional groups.

A plasticizer may be added to reduce the viscosity of a compound. Like the main material, a polyolefin elastomer is suitable for the plasticizer. A material that reacts with the polyolefin elastomer (the main material) to establish a chemical bond therebetween is further preferred as the plasticizer. However, a plasticizer that does not react with the polyolefin elastomer also can be used. It is preferable that the plasticizer reduces a solvent that has been used for producing the plasticizer or a material that has been used for forming a desired polymer as much as possible.

A metal oxide is suitable for the filler to be added. Typical examples of the metal oxide include an aluminum oxide, a magnesium oxide, and a zinc oxide, and any of them can be used. Moreover, these materials also can be used in combination.

The filler may be surface treated, e.g., using a silane coupling agent, a titanate coupling agent, or an aluminum coupling agent. In this case, however, the coupling agent should be washed with a solvent or the like because an unreacted coupling agent causes outgassing.

A well-known flame retardant may be used, and the most suitable material is a metal hydroxide represented by a magnesium hydroxide or aluminum hydroxide. The flame retardancy is achieved generally by producing an incombustible gas to block oxygen. However, this kind of flame retardant should not be used because it causes outgassing or corrosive gas.

A well-known antioxidant may be used, and the most suitable material is hindered phenol. The hindered phenol is decomposed easily by the filler added and causes outgassing or corrosive gas. Therefore, the addition of the filler should be minimized enough to achieve the antioxidative effect.

A conductive rubber may be used to suppress static electricity. The added filler may include a conductive material, and carbon or graphite is suitable.

It is preferable that a release film is coated with a fluorine compound. However, a general silicone compound should not be used because low molecular-weight siloxane contained in the silicone compound causes outgassing. A film coated with a phlorosilicone compound should not be used as well.

It is preferable that the sheet is processed in the absence of a solvent. This is because the solvent causes outgassing.

Examples of the processing method include calendering, press molding, and extrusion molding, and any of them can be used.

Molding as well as cutting and packing of the products is performed preferably in a clean room to prevent the adhesion of dust.

The distillation is accompanied generally by heating under a reduced pressure. It is preferable that the distillation is performed while forming the distilled material into a thin film. An apparatus used for this method has been commercially available.

It is preferable that the thermally conductive sheet of the present invention is arranged between a base film and a cover film, and the base film and the cover film have releasability so that the releasability of the base film is higher than that of the cover film. Moreover, it is preferable that the cover film has notches so that the thermally conductive sheet can be peeled off each unit, and the area of the cover film is larger than that of the thermally conductive sheet per unit. With this configuration, a worker can stick the thermally conductive sheet easily on electronic components or the like without directly touching it.

Figure 1B:
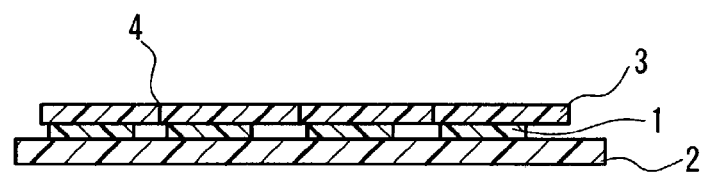
FIG. 1B is a cross-sectional view of FIG. 1A.

FIG. 1A is a plan view of a thermally conductive sheet according to an embodiment of the present invention. As shown in FIG. 1A, thermally conductive sheets 1 are attached to a base film 2 so that they can be peeled off each unit. FIG. 1B is a cross-sectional view of FIG. 1A. As shown in FIG. 1B, a cover film 3 having notches 4 is arranged on the thermally conductive sheets 1. The base film 2 and the cover film 3 have releasability so that the releasability of the base film 2 is higher than that of the cover film 3. The area of the cover film 3 is larger than that of the thermally conductive sheet 1 per unit.

Figure 2:
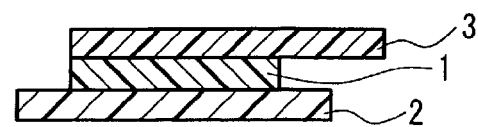
FIG. 2 is a cross-sectional view of a thermally conductive sheet per unit according to an embodiment of the present invention.

FIG. 2 is a cross-sectional view of the thermally conductive sheet 1 per unit. Upon removal of the cover film 3, the thermally conductive sheet 1 is peeled off the base film 2 and attached to the cover film 3. Since the cover film 3 is larger than the thermally conductive sheet 1, a worker can hold the end of the cover film 3 and stick the thermally conductive sheet 1 on the position of a desired electronic component.

A polyolefin elastomer based thermally conductive sheet of the present invention can reduce the amount of organic gas generated per unit surface area to 1000 $\mu g/cm^2$ or less, and the amount of corrosive gas generated per unit surface area to 10 $\mu g/cm^2$ or less. Moreover, it can achieve a thermal conductivity of 0.5 to 20 W/m·K. The amount of organic gas generated per unit surface area is preferably in the range of 1 to 1000 $\mu g/cm^2$.

EXAMPLES

The present invention will be described in more detail by way of examples. A polyolefin elastomer based polymer used in the following examples and comparative examples is an elastomer obtained by introducing an allyl group at both terminals of polyisobutylene and expressed by

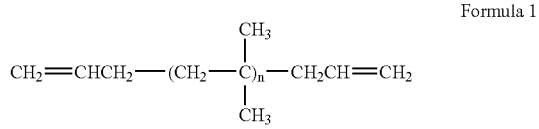

Formula 1 where n ranges from 80 to 300.

The polyolefin elastomer based polymer ("EP200A" manufactured by, Kaneka Corporation) is produced under impurity removal controls and can be used for manufacturing a product of the present invention without the pressure-reduced aspiration (Examples 1 to 3). The products of Examples 4 and 5 are improved by further reducing the generation of an organic gas and a corrosive gas.

Example 1

To 100 parts by weight of polyolefin elastomer based polymer ("EP200A" manufactured by Kaneka Corporation) was added 300 parts by weight of aluminum oxide ("AL30" manufactured by Showa Denko, having an average particle diameter of 2 μm), 100 parts by weight of aluminum hydroxide ("H32" manufactured by Showa Denko), 4 parts by weight of crosslinking agent ("CR-100"manufactured by Kaneka Corporation), 2 parts by weight of iron black (having an average particle diameter of 2 μm), 25 μl of curing agent, 25 μl of retarder, and an antioxidant ("Sumilizer BP-101"manufactured by Sumitomo Chemical Co., Ltd.). This mixture was kneaded into a compound.

The compound was sandwiched between films, each of which was coated with fluorine to obtain releasability, and then press-molded at 100° C. for 30 minutes, producing a 0.5 mm thick sheet. The hardness of the sheet measured with a Type A durometer was 10.

Example 2

To 100 parts by weight of polyolefin elastomer based polymer ("EP200A" manufacture by Kaneka Corporation) was added 300 parts by weight of magnesium oxide ("PYROKISUMA 5301" manufactured by Kyowa Chemical Industry Co., Ltd., having an average particle diameter of 2 μm), 4 parts by weight of crosslinking agent ("CR-100" manufactured by Kaneka Corporation), 2 parts by weight of iron black, 25 μl of curing agent, 25 μl of retarder, and an antioxidant ("Sumilizer BP- 101" manufactured by Sumitomo Chemical Co., Ltd.). This mixture was kneaded into a compound.

The compound was sandwiched between films, each of which was coated with fluorine to obtain releasability, and then press-molded at 100° C. for 30 minutes, producing a 0.5 mm thick sheet. The hardness of the sheet measured with a Type A durometer was 15.

Example 3

To 100 parts by weight of polyolefin elastomer based polymer ("EP200A" manufactured by Kaneka Corporation) was added 250 parts by weight of aluminum oxide ("AL30" manufactured by Showa Denko), 250 parts by weight of manganese-zinc ferrite (manufactured by Toda Kogyo Corporation, having a particle diameter of 3 μm), 4 parts by weight of crosslinking agent ("CR-100" manufactured by Kaneka Corporation), 2 parts by weight of iron black, 25 μl of curing agent, 25 μl of retarder, and an antioxidant ("Sumilizer BP-101" manufactured by Sumitomo Chemical Co., Ltd.). This mixture was kneaded into a compound.

The compound was sandwiched between films, each of which was coated with fluorine to obtain releasability, and then press-molded at 100° C. for 30 minutes, producing a 0.5 mm thick sheet. The hardness of the sheet measured with a Type A durometer was 40.

Comparative Example 1

To 100 parts by weight of polyurethane resin ("U-217 A/B" manufactured by Nihon Gosei Co., Ltd., containing 50 parts by weight each) was added 300 parts by weight of aluminum oxide ("AL30" manufactured by Showa Denko), 100 parts by weight of aluminum hydroxide ("H321" manufactured by Showa Denko), 2 parts by weight of iron black, and an antioxidant ("Sumilizer BP-101" manufactured by Sumitomo Chemical Co., Ltd). This mixture was kneaded into a compound.

The compound was sandwiched between films, each of which was coated with fluorine to obtain releasability, and then press-molded at 70° C. for 10 minutes, producing a 0.5 mm thick sheet. The hardness of the sheet measured with a Type A durometer was 20.

Comparative Example 2

To 100 parts by weight of polyurethane resin ("U-217 A/B" manufactured by Nihon Gosei Co., Ltd., containing 50 parts by weight each) was added 300 parts by weight of magnesium oxide ("PYROKISUMA 5301K" manufactured by Kyowa Chemical Industry Co., Ltd), 100 parts by weight of aluminum hydroxide ("H32I" manufactured by Showa Denko), 2 parts by weight of iron black, and an antioxidant ("Sumilizer BP-101" manufactured by Sumitomo Chemical Co., Ltd.). This mixture was kneaded into a compound.

The compound was sandwiched between films, each of which was coated with fluorine to obtain releasability, and then press-molded at 70° C. for 10 minutes, producing a 0.5 mm thick sheet. The hardness of the sheet measured with a Type A durometer was 25.

Comparative Example 3

To 100 parts by weight of silicone gel ("SE1885" manufactured by Toray Dow Corning Silicone Co., Ltd.) was added 300 parts by weight of aluminum oxide ("AL30" manufactured by Showa Denko), 100 parts by weight of aluminum hydroxide ("H32I" manufactured by Showa Denko), and 2 parts by weight of iron black. This mixture was kneaded into a compound.

The compound was sandwiched between films, each of which was coated with fluorine to obtain releasability, and then press-molded at 100° C. for 10 minutes, producing a 0.5 mm thick sheet. The hardness of the sheet measured with a Type A durometer was not more than 5.

Table 1 shows the amounts of organic gas and corrosive gas generated per unit surface area, the thermal performance, and the electromagnetic wave characteristics of each sheet in Examples 1 to 3 and Comparative Examples 1 to 3. The electromagnetic wave characteristics are evaluated by a dielectric constant. The corrosive gas includes inorganic and organic substances. The inorganic substances are quantified as negative ions, while the organic substances are quantified by themselves.

TABLE 1

|  |  | Example 1 | Example 2 | Example 3 |
|---|---|---|---|---|
| Thermal conductivity W/m · k |  | 1.1 | 1.5 | 0.8 |
| Dielectric constant 100 Hz |  | 5.5 | 5.5 | 10 |
| Organic gas µg/cm$^2$ | Acetone | 0.05 | 0.05 | 0.05 |
|  | Toluene | 0.09 | 0.09 | 0.09 |
|  | Ethylcyclohexane | 0.43 | 0.43 | 0.43 |
|  | Ethylbenzene | 0.05 | 0.05 | 0.05 |
|  | p-xylene + m-xylene | 0.10 | 0.10 | 0.10 |
|  | o-xylene | 0.04 | 0.04 | 0.04 |
|  | Siloxane D4–D20 | 0 | 0 | 0 |
|  | Other substances | 2.40 | 2.40 | 2.40 |
|  | Total | 3.16 | 3.16 | 3.16 |
| Corrosive gas µg/cm$^2$ | Inorganic substances | | | |
|  | F$^-$ | <0.01 | <0.01 | <0.01 |
|  | Cl$^-$ | 0.04 | 0.05 | 0.05 |
|  | NO$_3^-$ | <0.02 | <0.02 | 0.5 |
|  | BR$^-$ | <0.02 | <0.02 | <0.02 |
|  | PO$_4^{3-}$ | <0.03 | <0.03 | <0.03 |
|  | SO$_4^{2-}$ | <0.02 | 0.05 | 0.1 |
|  | Organic substances | | | |
|  | Formic acid | <0.02 | <0.02 | <0.02 |
|  | Acetic acid | <0.03 | <0.03 | <0.03 |
|  | Phthalic acid | <0.2 | <0.2 | <0.2 |
|  | Methacrylic acid | <0.2 | <0.2 | <0.2 |
|  | Oxalic acid | <0.03 | <0.03 | <0.03 |
|  | Total | <0.62 | <0.66 | <1.19 |

|  |  | Comparative Example 1 | Comparative Example 2 | Comparative Example 3 |
|---|---|---|---|---|
| Thermal conductivity W/m · k |  | 1.1 | 1.5 | 1.5 |
| Dielectric constant 100 Hz |  | 5.5 | 5.5 | 5.5 |
| Organic gas µg/cm$^2$ | Acetone | 1 | 1 | 1 |
|  | Toluene | 100 | 100 | 20 |
|  | Ethylcyclohexane | 100 | 100 | 20 |
|  | Ethylbenzene | 100 | 100 | 20 |
|  | p-xylene + m-xylene | 200 | 200 | 20 |
|  | o-xylene | 200 | 200 | 20 |
|  | Siloxane D4–D20 | 0 | 0 | 3000 |
|  | Other substances | 350 | 350 | 15 |
|  | Total | 1051 | 1051 | 3116 |
| Corrosive gas µg/cm$^2$ | Inorganic substances | | | |
|  | F$^-$ | 0.02 | 0.02 | <0.01 |
|  | Cl$^-$ | 0.05 | 0.05 | 1.2 |
|  | NO$_3^-$ | 0.5 | 0.5 | <0.02 |
|  | Br$^-$ | 0.03 | 0.03 | <0.02 |
|  | PO$_4^{3-}$ | 0.04 | 0.04 | 1.0 |
|  | SO$_4^{2-}$ | 0.1 | 0.1 | <0.02 |
|  | Organic substances | | | |
|  | Formic acid | 1.0 | 1.0 | <0.02 |
|  | Acetic acid | 3.0 | 3.0 | <0.03 |
|  | Phthalic acid | 0.5 | 0.5 | <0.2 |
|  | Methacrylic acid | 3.0 | 3.0 | <0.2 |
|  | Oxalic acid | 3.0 | 3.0 | <0.03 |
|  | Total | 11.24 | 11.24 | <2.75 |

Note: D of siloxane indicates the degree of polymerization.

As can be seen from Table 1, the generation of organic gas and corrosive gas is reduced in the thermally conductive sheets using a polyolefin elastomer.

Moreover, the following experiments were conducted.

Example 4

Polyolefin elastomer based polymer ("EP200A" manufactured by Kaneka Corporation) was aspirated under a reduced pressure of 0.4 mmHg at 80° C. for 24 hours. To 100 parts by weight of the polyolefin elastomer based polymer was added 300 parts by weight of aluminum oxide ("AL30" manufactured by Showa Denko), 100 parts by weight of aluminum hydroxide ("H32I" manufactured by Showa Denko), 4 parts by weight of crosslinking agent ("CR-100" manufactured by Kaneka Corporation), 2 parts by weight of iron black, 25 µl of curing agent, 25 µl of retarder, and an antioxidant ("Sumilizer BP-101" manufactured by Sumitomo Chemical Co., Ltd.). This mixture was kneaded into a compound.

The compound was sandwiched between films, each of which was coated with fluorine to obtain releasability, and then press-molded at 100° C. for 30 minutes, producing a 0.5 mm thick sheet. The hardness of the sheet measured with a Type A durometer was 10.

Example 5

To 100 parts by weight of polyolefin elastomer based polymer ("EP200A" manufactured by Kaneka Corporation) was added 300 parts by weight of washed aluminum oxide ("AL30" manufactured by Showa Denko), 100 parts by weight of aluminum hydroxide ("H32I" manufactured by Showa Denko), 4 parts by weight of crosslinking agent ("CR-100" manufactured by Kaneka Corporation), 2 parts by weight of iron black, 25 µl of curing agent, 25 µl of retarder, and an antioxidant ("Sumilizer BP-101" manufactured by Sumitomo Chemical Co., Ltd.). This mixture was kneaded into a compound.

In this example, the washed aluminum oxide was added after it was stirred in hot water at 70° C. for 5 hours, and then dried in a vibration drying device at 110° C. for 2 hours. The hardness of the sheet measured with a Type A durometer was 10.

Table 2 shows the amounts of organic gas and corrosive gas generated per unit surface area, the thermal performance, and the electromagnetic wave characteristics of each sheet in Examples 4 and 5. The electromagnetic wave characteristics are evaluated by a dielectric constant. The corrosive gas includes inorganic and organic substances. The inorganic substances are quantified as negative ions, while the organic substances are quantified by themselves.

TABLE 2

|  |  | Example 4 | Example 5 |
|---|---|---|---|
| Thermal conductivity W/m · k |  | 1.1 | 1.1 |
| Dielectric constant 100 Hz |  | 5.5 | 5.5 |
| Organic gas µg/cm$^2$ | Acetone | <0.01 | 0.05 |
|  | Toluene | <0.01 | 0.09 |
|  | Ethylcyclohexane | <0.01 | 0.43 |
|  | Ethylbenzene | <0.01 | 0.05 |
|  | p-xylene + m-xylene | <0.01 | 0.10 |
|  | o-xylene | <0.01 | 0.04 |
|  | Siloxane D4–D20 | 0 | 0 |
|  | Other substances | 1.01 | 2.40 |
|  | Total | <1.07 | 3.16 |

TABLE 2-continued

| | | | Example 4 | Example 5 |
|---|---|---|---|---|
| Corrosive gas $\mu g/cm^2$ | Inorganic substances | $F^-$ | <0.01 | <0.01 |
| | | $Cl^-$ | 0.04 | <0.01 |
| | | $NO_3^-$ | <0.02 | <0.02 |
| | | $Br^-$ | <0.02 | <0.02 |
| | | $PO_4^{3-}$ | <0.03 | <0.03 |
| | | $SO_4^{2-}$ | <0.02 | <0.02 |
| | Organic substances | Formic acid | <0.02 | <0.02 |
| | | Acetic acid | <0.03 | <0.03 |
| | | Phthalic acid | <0.2 | <0.2 |
| | | Methacrylic acid | <0.2 | <0.2 |
| | | Oxalic acid | <0.03 | <0.03 |
| | | Total | <0.62 | <0.59 |

Note: D of siloxane indicates the degree of polymerization.

As can be seen from Table 2, the generation of corrosive gas is reduced by washing the filler to be added (the filler was washed in Example 4, but not washed in Example 1). The generation of organic gas is reduced by heating the polyolefin elastomer under a reduced pressure.

Example 6

The sheet produced in Example 1 was processed in the following manner. Using a Thomson punch press, only the sheet was cut to a desired size with a film remaining on the other side of the sheet. After removal of burrs, a blade was inserted in the cuts of the sheet to cut away the remaining film. Then, another film having a thickness of 50 μm was prepared. The releasability of this film was lower than that of the film provided on the sheet. The film with lower releasability was attached to the adhesive surface of the sheet and pulled so that the sheet was separated from the film with higher releasability. Subsequently, the sheet was placed on a release board, resulting in a sheet with the film that serves as a tab by which the sheet can be held. For application, this sheet was separated from the release board by pulling the film (tab), and stuck on the intended object while peeling off the film. In this manner, the sheet was applied without touching the elastomer compound.

The cutting process is not limited to the above, and any method can be employed as long as the sheet has a tab or the like and is applied without touching the elastomer compound.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A thermally conductive sheet comprising:
a polyolefin elastomer mixed with a thermally conductive filler,
wherein the polyolefin elastomer is a polymer obtained in which an allyl group is present at both terminals polyisobutylene, and
volatile components, including residual solvent and an unreacted residual material, contained in the polyolefin elastomer are removed by distillation or reduced-pressure aspiration during or before producing the thermally conductive sheet, so that
an amount of volatile organic gas generated from the thermally conductive sheet per unit surface area is not more than 1000 μ/cm²,
an amount of volatile corrosive gas generated from the thermally conductive sheet per unit surface area is not more than 10 μg/cm², and
the thermally conductive sheet has a thermal conductivity of 0.5 to 20 W/m·K.

2. The thermally conductive sheet according to claim 1, further having electromagnetic wave absorption characteristics that show a voltage attenuation of not less than 4 dB in a frequency range of 10 to 1000 MHz.

3. The thermally conductive sheet according to claim 2, wherein the electromagnetic wave absorption characteristics are provided by inclusion of at least one magnetic metal powder selected from the group consisting of ferrite powder, nickel powder, carbonyl iron powder, aluminum powder, iron powder, silver powder, and amorphous alloy powder.

4. The thermally conductive sheet according to claim 3, wherein 100 parts by weight of polyolefin elastomer is mixed with 100 to 2000 parts by weight of magnetic metal powder.

5. The thermally conductive sheet according to claim 1, wherein the thermally conductive sheet has flexibility, and hardness as measured by a Type A durometer under the ASTM D2240 standards is 5 to 95.

6. The thermally conductive sheet according to claim 1, wherein the polyolefin elastomer is mixed with at least one thermally conductive filler selected from the group consisting of a metal oxide, a metal nitride, and a metal carbide.

7. The thermally conductive sheet according to claim 6 wherein, the thermally conductive filler is at least one selected from the group consisting of an aluminum oxide, a magnesium oxide, a zinc oxide, a potassium oxide, an aluminum nitride, a boron nitride, a silicon nitride, a silicon carbide, and a boron carbide.

8. The thermally conductive sheet according to claim 1, wherein 100 parts by weight of polyolefin elastomer is mixed with 50 to 3000 parts by weight of thermally conductive filler.

9. The thermally conductive sheet according to claim 8, wherein 100 parts by weight of polyolefin elastomer is mixed with 400 to 2200 parts by weight of thermally conductive filler.

10. The thermally conductive sheet according to claim 1, wherein the thermally conductive sheet is arranged between a base film and a cover film, and the base film and the cover film have releasability so that the releasability of the base film is higher than that of the cover film.

11. The thermally conductive sheet according to claim 10, wherein the cover film has matches so that the thermally conductive sheet is peeled off each unit, and an area of the cover film is larger than that of the thermally conductive sheet per unit.

12. The thermally conductive sheet according to claim 10, wherein the amount of volatile organic gas generated from the thermally conductive sheet is 1 to 1000 μg/cm² per unit surface area.

* * * * *